US010936765B2

(12) United States Patent
Wang et al.

(10) Patent No.: US 10,936,765 B2
(45) Date of Patent: Mar. 2, 2021

(54) GRAPH CENTRALITY CALCULATION METHOD AND APPARATUS, AND STORAGE MEDIUM

(71) Applicant: TENCENT TECHNOLOGY (SHENZHEN) COMPANY LIMITED, Guangdong (CN)

(72) Inventors: Rui Wang, Shenzhen (CN); Jun Yin, Shenzhen (CN); Yong Kun Li, Shenzhen (CN); Wei Chen, Shenzhen (CN)

(73) Assignee: TENCENT TECHNOLOGY (SHENZHEN) COMPANY LIMITED, Shenzhen (CN)

( * ) Notice: Subject to any disclaimer, the term of this patent is extended or adjusted under 35 U.S.C. 154(b) by 180 days.

(21) Appl. No.: 16/227,736

(22) Filed: Dec. 20, 2018

(65) Prior Publication Data

US 2019/0121926 A1 Apr. 25, 2019

Related U.S. Application Data

(63) Continuation of application No. PCT/CN2017/107631, filed on Oct. 25, 2017.

(30) Foreign Application Priority Data

Oct. 27, 2016 (CN) .......................... 201610971157.8

(51) Int. Cl.
*G06F 16/50* (2019.01)
*G06F 16/901* (2019.01)
(Continued)

(52) U.S. Cl.
CPC .............. *G06F 30/18* (2020.01); *G06F 16/00* (2019.01); *G06F 16/285* (2019.01);
(Continued)

(58) Field of Classification Search
CPC .. G06Q 30/0201; G06Q 50/01; G06F 16/285; G06F 16/00; G06F 30/18; G06F 16/9024
(Continued)

(56) References Cited

U.S. PATENT DOCUMENTS

2010/0063973 A1\* 3/2010 Cao ..................... G06F 16/2462
707/758
2012/0275702 A1\* 11/2012 Tuzel ....................... G06T 7/11
382/173

(Continued)

FOREIGN PATENT DOCUMENTS

CN        101887460 A      11/2010
CN        103179198 A       6/2013
(Continued)

OTHER PUBLICATIONS

Written Opinion dated Jan. 25, 2018, from the International Searching Authority in International Application No. PCT/CN2017/107631.

(Continued)

*Primary Examiner* — Kuen S Lu
(74) *Attorney, Agent, or Firm* — Sughrue Mion, PLLC

(57) ABSTRACT

A graph centrality determining method includes sampling, at least twice, nodes that are sequentially-connected and connection edges between the nodes, in an original graph representing a network structure, to obtain sampled sub-graphs, determining an influence of each of nodes in the sampled sub-graphs, forming a graph centrality determining result of each of the sampled sub-graphs, based on the influence of each of the nodes in the sampled sub-graphs, determining result of each of the sampled sub-graphs, to the original graph, to obtain an influence of each of the nodes in the original graph, clustering the influence of each of the nodes in the original graph, sorting the influence of each of the nodes in the original graph in descending order of a (Continued)

result of the clustering, and obtaining a predetermined quantity of nodes having influences that are top-ranked, in the original graph.

18 Claims, 13 Drawing Sheets

(51) Int. Cl.
   *G06F 16/28* (2019.01)
   *G06F 30/18* (2020.01)
   *G06F 16/00* (2019.01)
   *G06Q 50/00* (2012.01)
   *G06Q 30/02* (2012.01)

(52) U.S. Cl.
   CPC ..... *G06F 16/9024* (2019.01); *G06Q 30/0201* (2013.01); *G06Q 50/01* (2013.01)

(58) Field of Classification Search
   USPC ........................................................ 707/737
   See application file for complete search history.

(56) References Cited

U.S. PATENT DOCUMENTS

| | | | | |
|---|---|---|---|---|
| 2013/0097138 A1* | 4/2013 | Barkol | .............. | G06F 16/24544 707/706 |
| 2013/0232263 A1* | 9/2013 | Kelly | .................. | G06F 16/285 709/224 |
| 2014/0274246 A1* | 9/2014 | Tsai | ......................... | A63F 13/67 463/9 |
| 2014/0297740 A1* | 10/2014 | Narayanan | ............. | G06Q 10/10 709/204 |
| 2014/0344230 A1* | 11/2014 | Krause | ................ | G06F 16/9535 707/693 |
| 2015/0269139 A1* | 9/2015 | McAteer | ............... | G06F 16/367 704/9 |

FOREIGN PATENT DOCUMENTS

| | | |
|---|---|---|
| CN | 104063507 A | 9/2014 |
| CN | 104866588 A | 8/2015 |
| CN | 104951531 A | 9/2015 |
| CN | 105045967 A | 11/2015 |
| CN | 105528407 A | 4/2016 |
| CN | 105956040 A | 9/2016 |

OTHER PUBLICATIONS

Communication dated Apr. 1, 2020, from the China National Intellectual Property Administration in Application No. 201610971157.8.

Communication dated Oct. 16, 2020, from the China National Intellectual Property Administration in Application No. 201610971157.8.

International Search Report for PCT/CN2017/107631 dated, Jan. 28, 2018 (PCT/ISA/210).

* cited by examiner

Set R = 4 and L = 3 for each node

GRAPH CENTRALITY CALCULATION METHOD AND APPARATUS, AND STORAGE MEDIUM

CROSS-REFERENCE TO RELATED APPLICATIONS

This application is a continuation of International Patent Application No. PCT/CN2017/107631 filed on Oct. 25, 2017, which claims priority from Chinese Patent Application No. 201610971157.8, filed in the Chinese Patent Office on Oct. 27, 2016, and entitled "Graph Centrality Calculation Method and Apparatus," which are incorporated herein by reference in their entireties.

BACKGROUND

1. Field

Methods and apparatuses consistent with example embodiments relate to graph theory technologies, and in particular, to a graph centrality calculation method, a graph centrality calculation apparatus, and a storage medium.

2. Description of Related Art

With the rapid development of the Internet, it is increasingly important to analyze a network and especially an online social network, to provide more valuable service. A graph calculation method performed for the network becomes a network analysis method that is widely used now.

As an objective used to perform graph calculation for a network, calculation of graph centrality refers to that some most important nodes are found from a graph corresponding to the network. Calculated nodes may be different based on different networks.

For example, the graph centrality may refer to some most influential users in an online social network (OSN), or some most important stations in an urban transport network, or some most popular products in an online store.

A node size in a network continuously expands. Using an online social network as an example, a quantity of users continuously increases. Correspondingly, the size of a corresponding graph also continuously increases. For example, millions of nodes and billions of edges (association lines between the nodes) may be included in the graph. This undoubtedly results in that calculation of graph centrality also becomes increasingly difficult.

On one hand, calculation of graph centrality results in large overheads of calculation resources, results in excessive costs due to excessive calculation resources, and is difficult to be implemented.

On the other hand, a process of the calculation of the graph centrality is tediously long, resulting in large time overheads, and affecting the timeliness depending on a calculation result of the graph centrality.

There is a need for an effective solution in which a relative technology is used to reduce calculation resource overheads for calculation of the graph centrality and improve the timeliness of the graph centrality calculation.

SUMMARY

According to embodiments, there is provided a graph centrality determining method, the method being performed by at least one processor, and the method including sampling, at least twice, nodes that are sequentially-connected and connection edges between the nodes, in an original graph representing a network structure, to obtain sampled sub-graphs, determining an influence of each of nodes in the sampled sub-graphs, and forming a graph centrality determining result of each of the sampled sub-graphs, based on the influence of each of the nodes in the sampled sub-graphs. The method includes mapping the graph centrality determining result of each of the sampled sub-graphs, to the original graph, to obtain an influence of each of the nodes in the original graph, clustering the influence of each of the nodes in the original graph, sorting the influence of each of the nodes in the original graph in descending order of a result of the clustering, and obtaining a predetermined quantity of nodes having influences that are top-ranked, in the original graph.

According to embodiments, there is provided a graph centrality determining apparatus including at least one memory configured to store computer program code, and at least one processor configured to access the at least one memory and operate according to the computer program code. The computer program code includes sampling code configured to cause the at least one processor to sample, at least twice, nodes that are sequentially-connected and connection edges between the nodes, in an original graph representing a network structure, to obtain sampled sub-graphs, and determining code configured to cause the at least one processor to determine an influence of each of nodes in the sampled sub-graphs, and form a graph centrality determining result of each of the sampled sub-graphs, based on the influence of each of the nodes in the sampled sub-graphs. The computer program code further includes mapping code configured to cause the at least one processor to map the graph centrality determining result of each of the sampled sub-graphs, to the original graph, to obtain an influence of each of the nodes in the original graph, and clustering code configured to cause the at least one processor to cluster the influence of each of the nodes in the original graph, sort the influence of each of the nodes in the original graph in descending order of a result of the clustering, and obtain a predetermined quantity of nodes having influences that are top-ranked, in the original graph.

According to embodiments, there is provided a non-transitory computer-readable storage medium storing instructions that cause at least one processor to sample, at least twice, nodes that are sequentially-connected and connection edges between the nodes, in an original graph representing a network structure, to obtain sampled sub-graphs, determine an influence of each of nodes in the sampled sub-graphs, and form a graph centrality determining result of each of the sampled sub-graphs, based on the influence of each of the nodes in the sampled sub-graphs. The instructions further cause the at least one processor to map the graph centrality determining result of each of the sampled sub-graphs, to the original graph, to obtain an influence of each of the nodes in the original graph, cluster the influence of each of the nodes in the original graph, sort the influence of each of the nodes in the original graph in descending order of a result of the clustering, and obtain a predetermined quantity of nodes having influences that are top-ranked, in the original graph.

DESCRIPTION OF EMBODIMENTS

Figure 1:
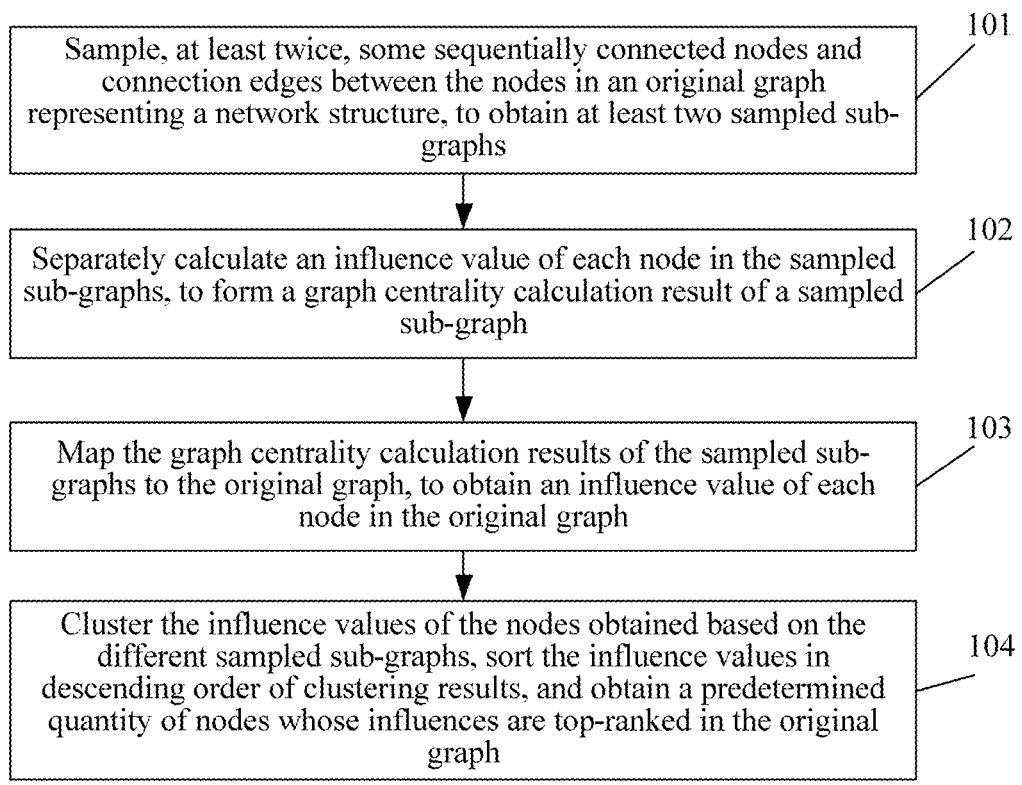
FIG. 1 is an optical schematic flowchart of a method for rapidly calculating graph centrality of a large graph according to an embodiment.

The following further describes the disclosure in detail with reference to the accompanying drawings and embodiments. The embodiments described herein are used to explain the disclosure but are not intended to limit the disclosure. In addition, the embodiments described below are some embodiments used for implementing the disclosure instead of all embodiments. A person of ordinary skill in the art obtains embodiments by recombining the technical solutions of the embodiments and implements other embodiments without creative efforts, and all the embodiments fall within the protection scope.

In the embodiments, the terms "include," "include," and any variants thereof are intended to cover a non-exclusive inclusion. Therefore, a method or an apparatus that includes a series of elements not only includes such elements described clearly, but also includes other elements not listed expressly, or may include inherent elements for implementing the method or apparatus. Unless otherwise specified, an element limited by "include a/an . . . " does not exclude other relevant elements (for example, a step in the method or a unit in the apparatus) existing in the method or apparatus that includes the element.

For example, the method provided in the embodiments includes a series of steps, but the method provided in the embodiments is not limited to the described steps. Similarly, the apparatus provided in the embodiments includes a series of units, but the apparatus provided in the embodiments is not limited to the clearly described units, and may further include a unit that is set to obtain related information or perform processing based on information.

Before the disclosure is further described in detail, nouns and terms mentioned in the embodiments are described. The nouns and terms mentioned in the embodiments are applied to the following explanations.

1) Network: It is a to-be-analyzed object (for example, a person or a substance), and the object has an association relationship or has a same or similar attribute.

For example, an online social network (OSN) includes hardware, software, a service, and applications (for example, various applications such as e-mail and instant messaging). Traditionally, a social network is used to refer to a social network service (SNS).

For another example, an urban transport network includes bus stations, metro stations, and the like.

2) Graph: Sequential pairs G=(V(G), E(G)) are called a graph. It is a nonempty limited set. An element in V(G) is called a vertex of a graph G, and E(G) is a subset of different nonsequential pair consolidation formed by all different elements in V(G).

For example, a graph is a graphical expression of a network formed after nodes in the network are connected, in which the nodes are associated by using a connection edge (or edge).

For example, for a graph of an online social network, a connection edge indicates an association formed between two social users based on the social network. For example, instant messaging was performed between the users, or the users followed each other.

For another example, for a graph of an online store, nodes in the graph correspond to different commodities, and a connection edge between the nodes indicates that there is association or consistency between the products in a property such as a purpose, a user group, or a product.

3) Graph centrality: It is also called centrality, and is used to measure importance of a node in a network formed by a plurality of nodes.

For example, the graph centrality may refer to some most influential users in an online social network (OSN), or some most important stations in an urban transport network, or some most popular products in an online store.

According to different application scenarios, importance of the node has different definitions, and corresponds to a plurality of different centrality definitions. Simplest graph centrality is degree centrality. In addition, the graph centrality further includes eigenvector centrality, PageRank, closeness centrality/intimacy centrality, betweenness centrality/between centrality, similarity, and the like. The degree centrality is a measurement indicator that is first put forward and whose concept is relatively simple.

4) Graph sampling: It refers to that some nodes and connection edges are selected from a graph, to form a sampled sub-graph.

5) Influence maximization (IM): It refers to that, in a set formed by suitably selecting k users from an OSN, as an initial node, the node finally can affect most users through influence spread. It is usually applied to commodity marketing.

6) Random walk (RW): It is a cyclic operation in which a node is randomly selected as a starting node, and then a neighboring node of the starting node is randomly selected as a new.

The following analyzes and describes the solution of graph centrality calculation with reference to the related technology.

For the foregoing graph centrality calculation, a plurality of corresponding solutions have been put forward in the related technology, and are roughly divided into three categories. The three types are separately described below.

First category: For the eigenvector centrality and the PageRank

Importance of a node depends on importance of each node pointing to the node. This centrality calculation method is iterative solving using a power method. Using the PageRank as an example, a PageRank algorithm is an algorithm used to search an engine for ranking of web pages, that is, calculate PageRank values of the web pages and sort the web pages according to the values.

A random walk process is mainly simulated between the web pages, and finally a steady state can be reached. That is, a probability distribution that the walk is stayed at the nodes tends to be stable, that is, corresponds to the PageRank values of the nodes. A process of solving using the power method is to first give an initial vector $x^{(0)T}$, which may be usually set to $e^T/n$, and a state transfer matrix P between the nodes on which convergence is processed is substituted into an iteration formula $x^{(k)T}=x^{(k-1)T}P$. A vector having a steady state is obtained after some steps of iteration, that is, corresponds to the PageRank values of the nodes.

Second category: Closeness centrality and betweenness centrality

This initially defined according to a shortest path between the nodes, and then is optimized based on random walk. This may be used as a definition of "the influence" in an influence maximization problem of OSNs. The influence maximization problem may be defined that, in a set formed by suitably selecting k users from an OSN, as initial influence, most users are finally affected through influence spread. It is usually applied to commodity marketing. A latest algorithm for resolving the influence maximization problem is an IMM algorithm put forward by Y. Tang et al. in 2015, and time complexity of $O((k+1)(n+m)\log n/\varepsilon^2)$ can be achieved.

The IMM algorithm is mainly divided into two stages: sampling and node selection.

At the sampling stage, a suitable quantity of random reverse reachable (RR) sets are generated through iteration, and the sets are added to a set $\mathcal{R}$. An RR set of a node represents a set of nodes that are backward reachable, that is, a node set that can affect the node. A random RR set represents an RR set of a randomly selected node. At the node selection stage, a standard greedy algorithm is used to select a random RR set that covers most nodes in the set $\mathcal{R}$ and whose size is k as a final result. If a node is in an RR set, it indicates that the node covers the RR set.

An IM-RW algorithm for influence maximization is further included. First, L steps of random walk processes are simulated for each node in a graph for R times, paths are recorded, and then the greedy algorithm is used to select a node set that is most frequently passed by all the random walk processes and whose size is k as the final result.

Third category: Similarity

The similarity is used to measure a similarity degree of two nodes in a graph. If the two nodes in the graph usually share a plurality of same neighboring nodes or the two nodes have a plurality of similar neighboring nodes, it is considered that the similarity degree of the two nodes is high.

The similarity is usually applied to query of similar documents in a file system or product marketing for similar crowds or related products. Calculation of the similarity is mainly divided into three categories: similarity between two nodes, similarity of all nodes in the graph with a specified node, and similarity of all node pairs in the graph. Definition of a similarity value that is most widely used now is SimRank put forward by Jeh and Widom. A SimRank value of a node pair is defined as follows:

$$s(a,b) = \begin{cases} 1, & a=b; \\ \dfrac{c}{|I(a)||I(b)|}\sum_{i=1}^{|I(a)|}\sum_{j=1}^{|I(b)|} s(I_i(a), I_j(b)), & a \neq b; \\ 0, & I(a)=\varnothing \text{ or } I(b)=\varnothing. \end{cases}$$

where $I(\alpha)$ represents an incoming edge set of a node $\alpha$, and $c \in (0, 1)$ represents an attenuation coefficient that is usually set to c=0.8 or c=0.6.

A latest algorithm (for a case of a single source) for calculating SimRank was put forward by Kusumoto M et al in 2014. The algorithm is mainly divided into two stages: preprocessing and query. At the preprocessing stage, an auxiliary upper boundary value of a SimRank value s(a, b) based on a distance d(a, b) is calculated for each node pair, and an auxiliary bipartite graph H is constructed and is used to more precisely enumerate "candidates" having a large similarity degree value with a queried node. At the query stage, top k nodes that are very similar to a to-be-queried node u are output. A calculation process is that precise calculation of the SimRank value is performed for the "candidates" having the large similarity degree value with u at the preprocessing stage, and top k candidates are selected.

As a graph size increasingly increases, calculation of graph centrality also becomes more difficult, and very large time overheads are caused.

According to the embodiments, for the problems of large resource consumption and time consumption that are resulted from calculation of graph centrality of a large graph (for example, a graph including millions of nodes and billions of edges, which is also applicable to a non-large graph) by using the related technology, to accelerate calculation of the graph centrality, a sampling technology is mainly used to perform sampling on the original large grapy, to obtain a sampled sub-graph, thereby reducing the size of the original graph, to resolve the problems of large time overheads and the calculation difficulty that are resulted from the excessive size of the graph.

FIG. 1 is an optional schematic flowchart of a method for rapidly calculating graph centrality of a large graph according to an embodiment. For an original graph (also called an original graph) of a network, when graph centrality calculation is performed, the calculation mainly includes the following steps: Step 101: Sample, at least twice, sequentially connected nodes and connection edges between the nodes in an original graph representing a network structure, to obtain at least two sampled sub-graphs. Step 102: Separately calculate an influence value of each node in the sampled sub-graphs, and form a graph centrality calculation result of a sampled sub-graph. Step 103: Map the graph centrality calculation results of the sampled sub-graphs to the original graph, to obtain an influence value of each node in the original graph. Step 104: Cluster the influence values of the nodes obtained based on the different sampled sub-graphs, sort the influence values in descending order of clustering results, and obtain a predetermined quantity of nodes whose influence values are top-ranked in the original graph.

According to some experiments provided by the embodiments, it is proved that the method for rapidly calculating the graph centrality based on sampling provided in the embodiments can effectively improving the calculating efficiency of the centrality, significantly reduce program runtime, and accelerate calculation of the graph centrality while ensuring the accuracy of a calculation result of the graph centrality.

In an example, the network is an online social network, and the nodes are users. When the method in the embodiments is used in a case of this example, in step 101, sequentially connected users and connection edges between the users in an original graph representing the online social network may be sampled at least twice, to obtain at least two sampled sub-graphs. In step 102, an influence of each user in the sampled sub-graphs may be determined, and a graph centrality determining result of a corresponding sampled sub-graph is formed. In step 103, the graph centrality determining results of the sampled sub-graphs are mapped to the original graph, to obtain an influence of each user in the original graph. In step 104, the influences of the users obtained based on the different sampled sub-graphs are clustered, the influences are sorted in descending order of clustering results, and a predetermined quantity of users whose influences are top-ranked in the original graph are obtained.

In an example, the network is an urban transport network, and the nodes are stations. When the method in the embodiments is used in a case of this example, in step 101, sequentially connected stations and connection edges between the stations in an original graph representing the urban transport network may be sampled at least twice, to obtain at least two sampled sub-graphs. In step 102, an influence of each station in the sampled sub-graphs may be determined, and a graph centrality determining result of a corresponding sampled sub-graph is formed. In step 103, the graph centrality determining results of the sampled sub-graphs are mapped to the original graph, to obtain an influence of each station in the original graph. In step 104, the influences of the stations obtained based on the different sampled sub-graphs are clustered, the influences are sorted in descending order of clustering results, and a predetermined quantity of stations whose influences are top-ranked in the original graph are obtained.

In an example, when the network is an online store, the nodes may be products. When the method in the embodiments is used in a case of this example, in step 101, sequentially connected commodities and connection edges between the commodities in an original graph representing the online social network may be sampled at least twice, to obtain at least two sampled sub-graphs. In step 102, an influence of each commodity in the sampled sub-graphs may be determined, and a graph centrality determining result of a corresponding sampled sub-graph is formed. In step 103, the graph centrality determining results of the sampled sub-graphs are mapped to the original graph, to obtain an influence of each commodity in the original graph. In step 104, the influences of the products obtained based on the different sampled sub-graphs are clustered, the influences are sorted in descending order of clustering results, and a predetermined quantity of products whose influences are top-ranked in the original graph are obtained.

When the method in the embodiments are used in the cases of the foregoing examples, the method may improve the efficiency of the determining process, shorten a time of the determining process, and solve calculation resources used by implementation of the method while ensuring the accuracy of determining some most influential users, some most important stations, or some most popular products.

The embodiments further provide a graph centrality calculation apparatus that is configured to implement the foregoing graph centrality calculation method based on sampling. The apparatus may implement the method in a plurality of manners. This is exemplarily described below.

Figure 2:
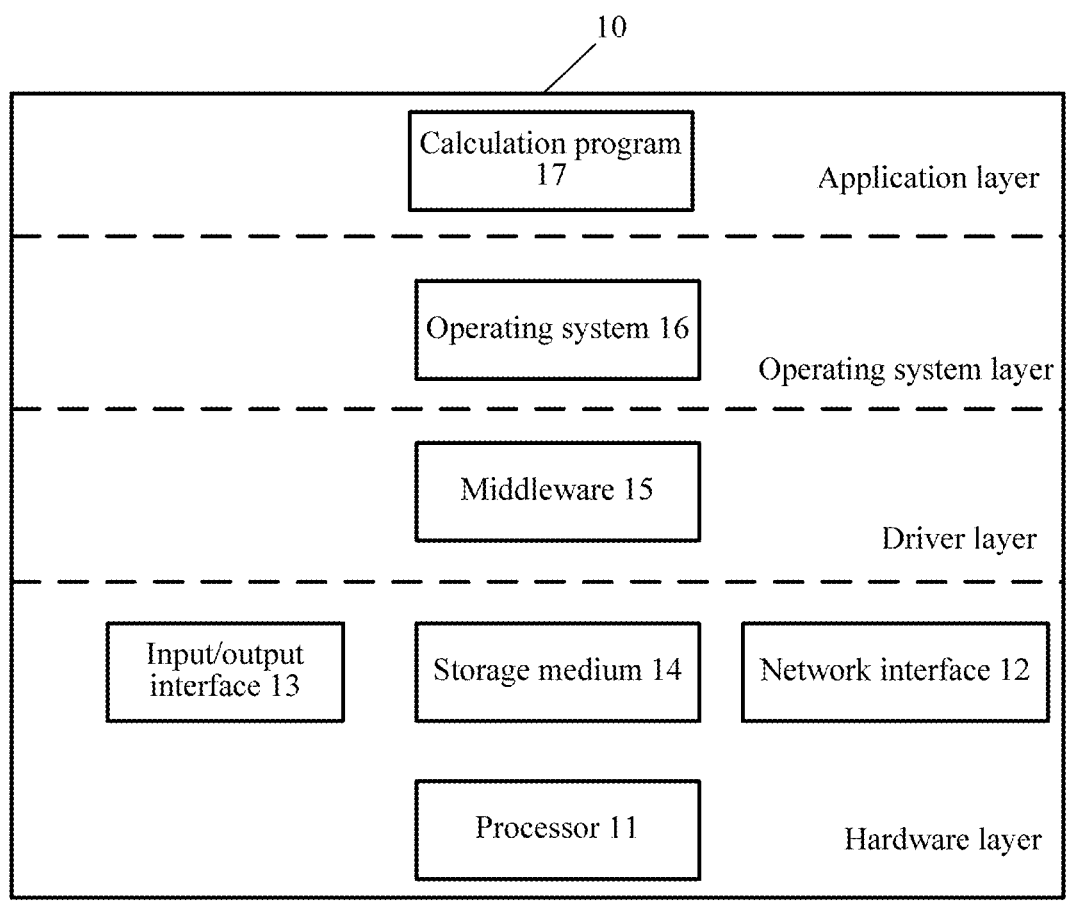
FIG. 2 is a schematic diagram of an optional software and hardware structure of a graph centrality calculation apparatus according to an embodiment.

FIG. 2 is a schematic diagram of an optional software and hardware structure of a graph centrality calculation apparatus according to an embodiment, in which the graph centrality calculation apparatus includes a hardware layer, an intermediate layer, an operating system layer, and a software layer. However, a person skilled in the art may understand that, the structure of the graph centrality calculation apparatus shown in FIG. 2 is only an example, and does not construct limitation to the structure of the graph centrality calculation apparatus. For example, the graph centrality calculation apparatus may be provided with more components according to an implementation requirement compared with FIG. 2, or some components may be omitted according to an implementation requirement.

The hardware layer of the graph centrality calculation apparatus includes a processor 11, an input/output interface 13, a storage medium 14, and a network interface 12. The components may be in connection and communication by using a bus.

The processor 11 may be implemented by using a central processing unit (CPU), a microcontroller unit (MCU), an application specific integrated circuit (ASIC), or a field programmable gate array (FPGA).

The input/output interface 13 may be implemented by using an input/output device such as a display screen, a touchscreen, or a speaker.

The storage medium 14 may be implemented by using a nonvolatile storage medium such as a flash memory, a hard disk, or a compact disc, or may be implemented by using a volatile storage medium such as a dynamic cache having a double data rate (DDR). The storage medium 14 stores an executable instruction for performing the foregoing method.

Exemplarily, the storage medium 14 may be integrally disposed with another component of the graph centrality calculation apparatus, or may be distributed and disposed relative to another component of the graph centrality calculation apparatus. The network interface 12 provides external data to the processor 11, for example, an access capability of the storage medium 14 disposed in another place. Exemplarily, the network interface 12 may perform near field communication based on a near field communication (NFC) technology, a Bluetooth technology, and a ZigBee technology, and in addition, may further implement a communications standard such as CDMA or WCDMA and another evolved standard.

The driver layer includes middleware 15, configured to enable an operating system 16 to identify the hardware layer and perform communication with the components of the hardware layer. For example, the middleware 15 may be a set of driver programs for the components of the hardware layer.

The operating system 16 is configured to provide a user-oriented graphical interface, and exemplarily, includes a plug-in icon, a background, and an application icon. The operating system 16 supports a user in controlling the device by using the graphical interface. Software environment of the foregoing device, for example, a type and a version of the operating system, are not limited in the embodiments.

For example, the operating system may be a Linux operating system, a UNIX operating system, or another operating system.

The application includes an application running on a terminal of a user side. As described above, when a function of graph centrality calculation is implemented, a graph centrality calculation program 17 runs in the application layer.

According to the embodiments, based on the influence maximization problem, a rapid graph centrality calculation framework based on sampling is used, and an IM-RWS algorithm based on the rapid graph centrality calculation framework is designed. According to the IM-RWS algorithm, processing of the rapid graph centrality calculation framework based on an original graph is converted into the following problem:

For a given network (for example, an OSN), which is recorded as G (V, E), through the graph centrality calculation, a smallest node set A (that is, a quantity k of nodes in the node set A may be as small as possible) is obtained from G (V, E). An influence of a node in the set is greater than influences of other nodes in G (V, E). This may be expressed by using the following formula:

$$\max(\sigma(A), |A|32\ k, A \subseteq V),$$

where $\sigma(A)$ represents a quantity of nodes affected by the node set A.

Figure 3A:
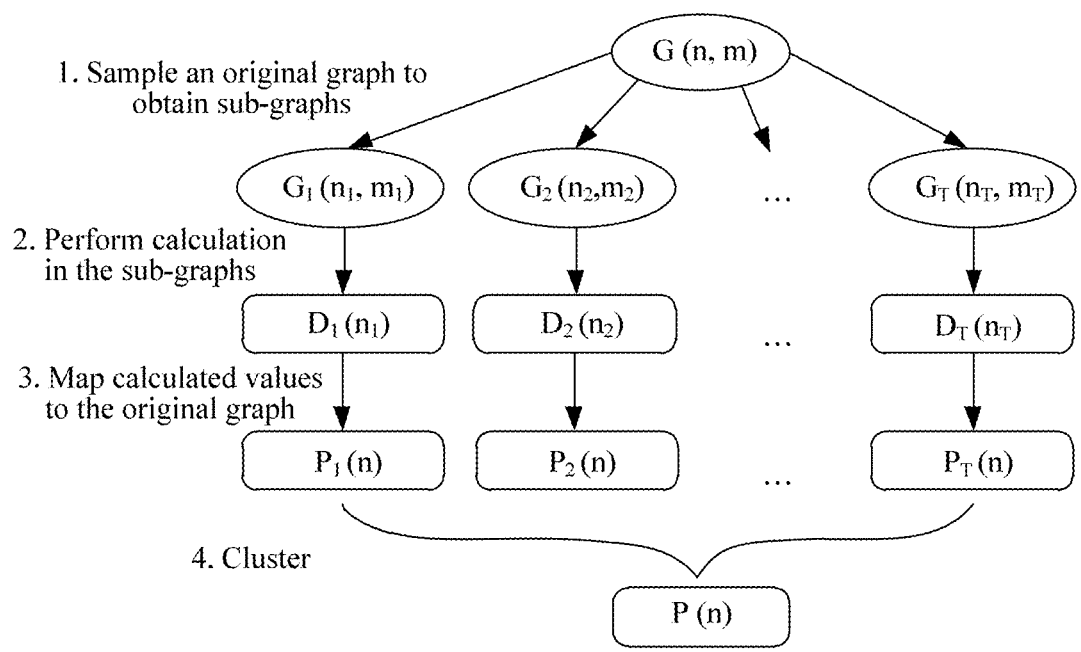
FIG. 3A is a schematic diagram of processing of an IM-RWS algorithm used for rapidly calculating graph centrality according to an embodiment.

Corresponding to the four processing stages of the graph centrality calculation method shown in FIG. 1, FIG. 3A is a schematic diagram of an IM-RWS algorithm used to perform rapid graph centrality calculation according to an embodiment. The IM-RWS algorithm is also divided into four corresponding steps. The four steps are described respectively.

Step 1: Sample, at least twice, sequentially connected nodes and connection edges between the nodes in an original graph representing a network structure, to obtain at least two sampled sub-graphs.

First, the original graph is sampled for T (an integer greater than or equal to 2) times, to obtain T sampled sub-graphs.

In this embodiment, the original graph is sampled by performing random walk. For example, for an original graph of a given social network, a random walk process is simulated on the original graph, and nodes passed by the random walk process and edges between the nodes (edges connecting the nodes) are sampled and saved, to obtain a smaller sampled sub-graph compared with the original graph. The sampling is repeated for a plurality of times, to obtain a plurality of sampled sub-graphs.

A sampled sub-graph is obtained by sampling some nodes and edges between the nodes in the original graph. It may be understood that the sampled sub-graph may be obtained from the original graph by using a plurality of methods. For example, a most direct method is to divide a tuple.

Figure 3B:
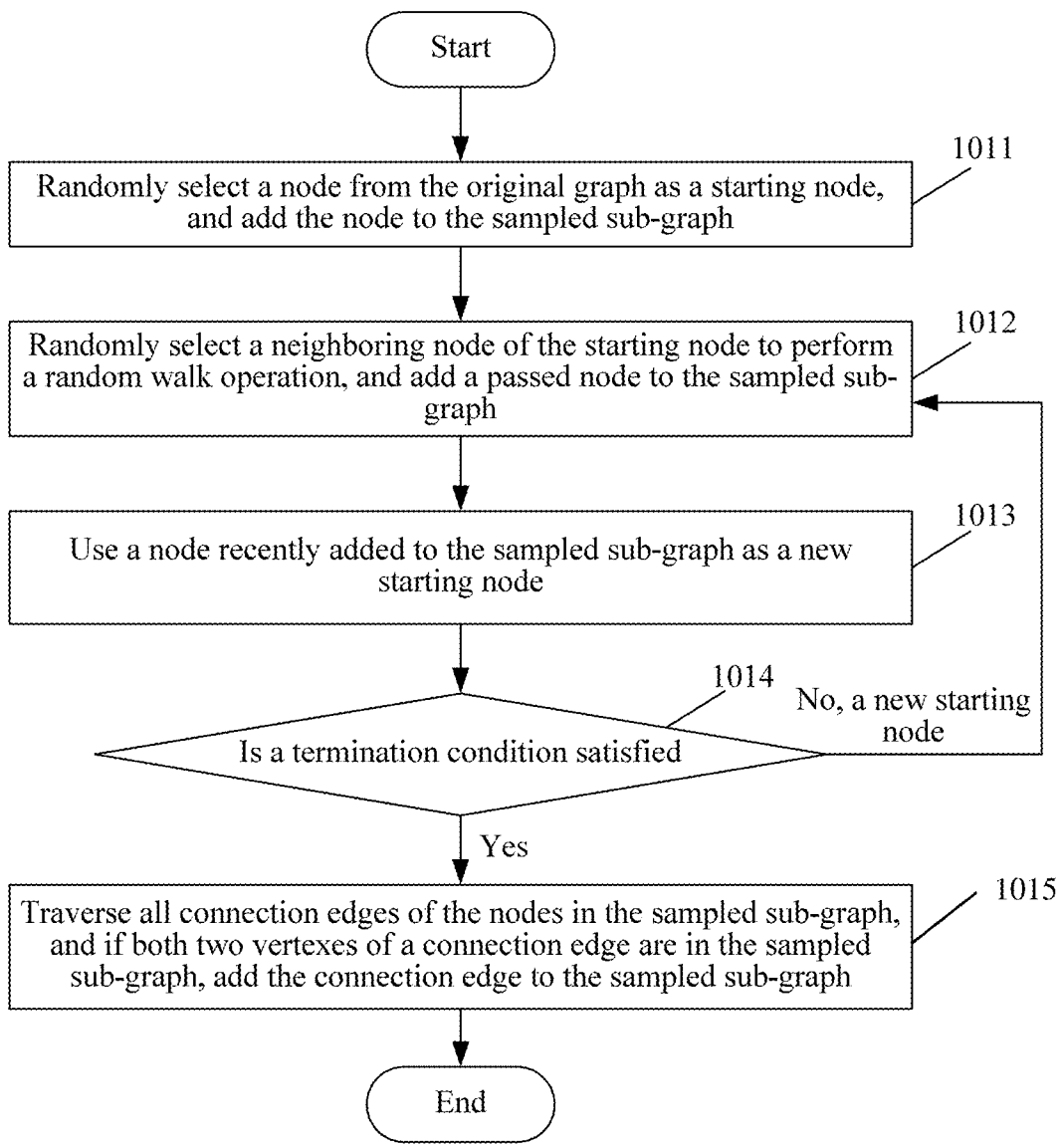
FIG. 3B is a flowchart of processing of the IM-RWS algorithm used for rapidly calculating the graph centrality according to the embodiment.

FIG. 3B is a flowchart of processing of the IM-RWS algorithm used for rapidly calculating the graph centrality according to the embodiment. As shown in FIG. 3B, an embodiment provides a method in which a sampled sub-graph is obtained from an original graph through random walk. For a given original graph, a calculation process of obtaining a sampled sub-graph is as follows.

Step 1011: Randomly select a node from the original graph as a starting node, and add the node to the sampled sub-graph.

As described above, because a plurality of sampled sub-graphs is obtained based on the original graph, optionally, when each new sampled sub-graph is obtained, the starting nodes selected from the original graph meets a principle that the starting nodes are evenly distributed in the original graph, to construct a plurality of sufficiently distinctive sampled sub-graphs.

For example, if three sampled sub-graphs is formed, starting nodes corresponding to the three samplings are respectively a node 1, a node 2, and a node 3. Based on the foregoing principle of even distribution, the node 1, the node 2, and the node 3 are equally distributed in an area of the original graph in a direction.

Step 1012: Randomly select a neighboring node of the starting node to perform a random walk operation, and add a passed node to the sampled sub-graph.

Step 1013: Use a node recently added to the sampled sub-graph as a new starting node, and repeat step 1012.

Step 1014: Determine whether a termination condition is satisfied: a quantity of nodes in the sampled sub-graph reaches a predetermined value n*, and if the termination condition is not satisfied, return to step 1012, otherwise, perform step 1015.

Step 1015: Traverse all connection edges of the nodes in the sampled sub-graph, and if both two vertexes of a connection edge are in the sampled sub-graph, add the connection edge to the sampled sub-graph.

Figure 4:
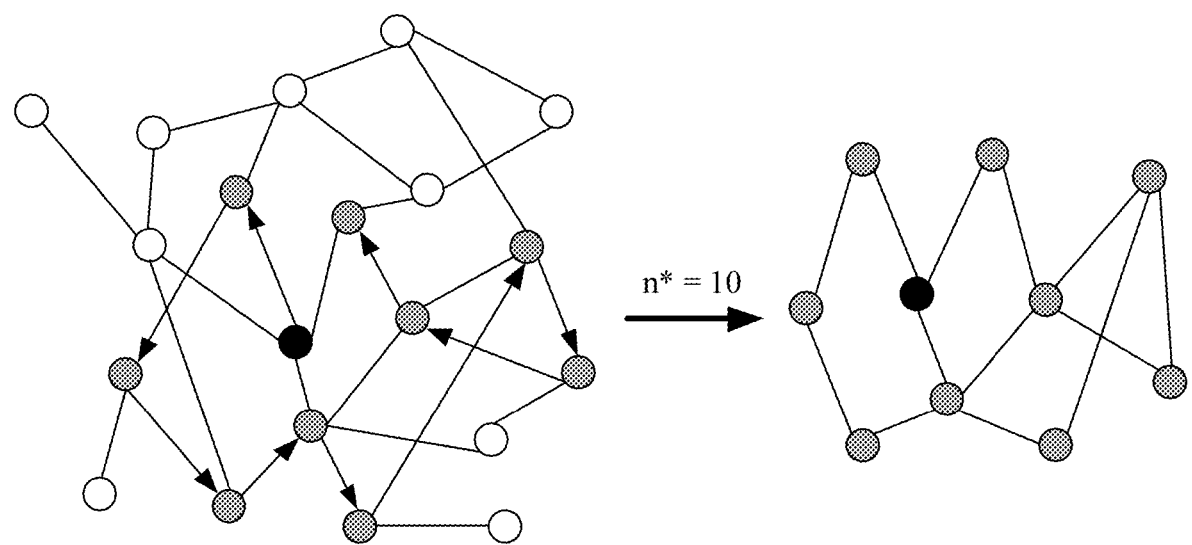
FIG. 4 is an optional schematic processing diagram of sampling by performing a random walk operation in an original graph according to an embodiment.

FIG. 4 is an optional schematic processing diagram of sampling in an original graph through random walk according to an embodiment. For a to-be-sampled original graph, a solid node is a selected starting node, a node to which an arrow points is a passed node during the random walk, and the arrow indicates a direction of the random walk. n* is set to 10. When a quantity of passed nodes reaches 10, the walk is stopped, and all the passed nodes and all connection edges between the nodes are added to the sampled sub-graph as a sampling result.

Referring back to FIG. 3A, step 2 includes separately calculating an influence of each node in the sampled sub-graphs, and a graph centrality determining result of a corresponding sampled sub-graph is formed.

For each sampled sub-graph obtained by sampling the original graph, influence values of nodes in the sampled sub-graph are calculated.

An algorithm for calculating centrality of the sampled sub-graph is not limited in this embodiment. For example, an algorithm for calculating the graph centrality provided in the related technology may be used.

Figure 3C:
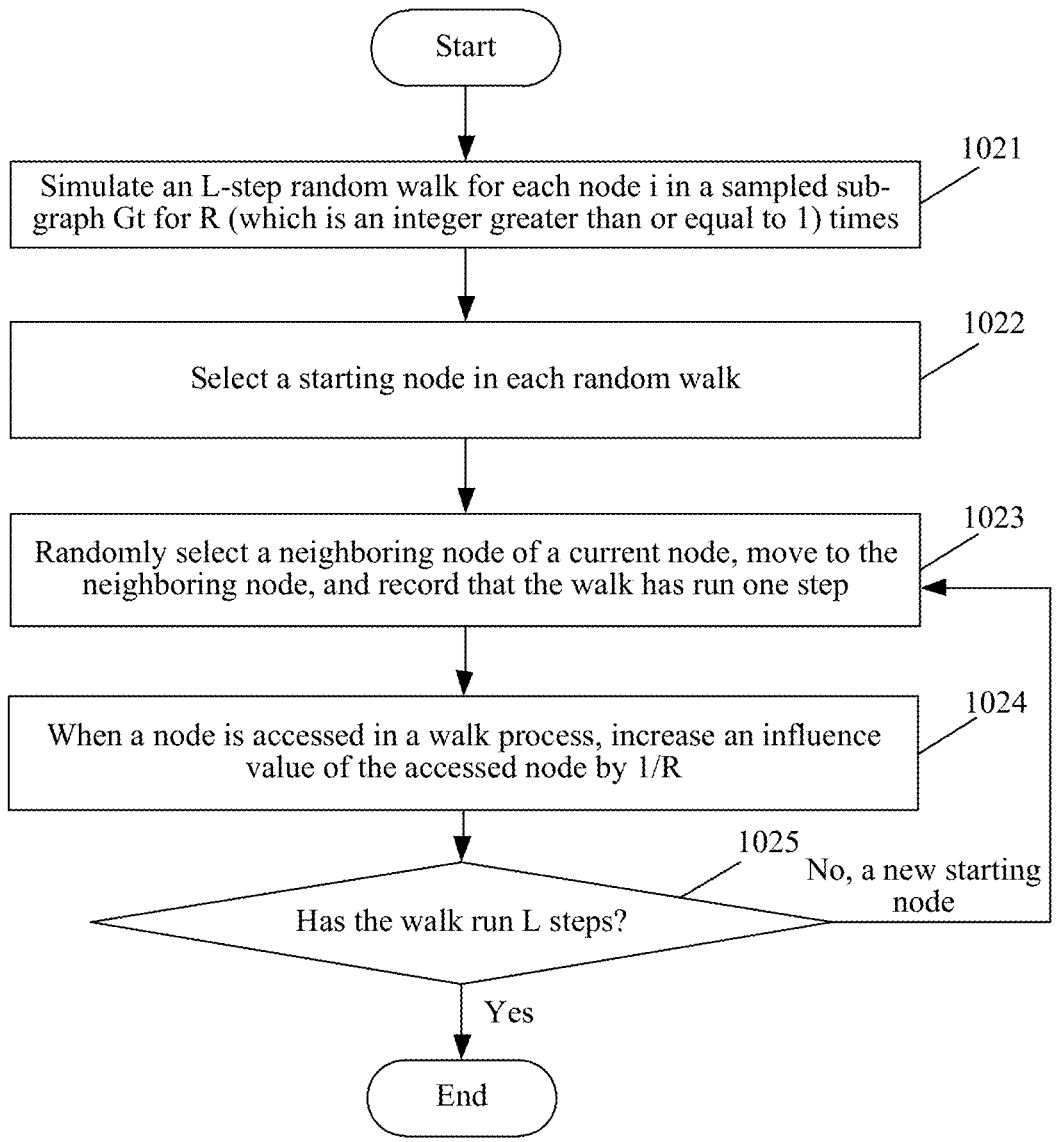
FIG. 3C is a schematic diagram of processing of the IM-RWS algorithm used for rapidly calculating the graph centrality according to the embodiment.

FIG. 3C is a schematic diagram of processing of the IM-RWS algorithm used for rapidly calculating the graph centrality according to the embodiment. In addition, based on an algorithm for calculating the graph centrality shown in FIG. 3C, an L-step random walk are simulated for each node in the sampled sub-graph for R times, and a probability that the node in the sampled sub-graph is accessed during the random walk is calculated. A calculation process is as follows:

Step 1021: Simulate an L-step random walk for each node i in a sampled sub-graph Gt for R (which is an integer greater than or equal to 1) times.

Step 1022: First select a starting node in each random walk.

Step 1023: Then randomly select a neighboring node of a current node, move to the neighboring node, and record that the walk has run one step.

Step 1024: When a node is accessed in a walk process, increase an influence value of the accessed node by 1/R.

Step 1025: Use a node that is currently reached through walk as a new starting node, and repeat step 1023 and step 1024 until the walk has run L steps.

After the random walk is performed for the sampled sub-graph for R times, an influence value of each node in the sampled sub-graph may be obtained, and the influence value is represented by Dt (n*).

Figure 5:
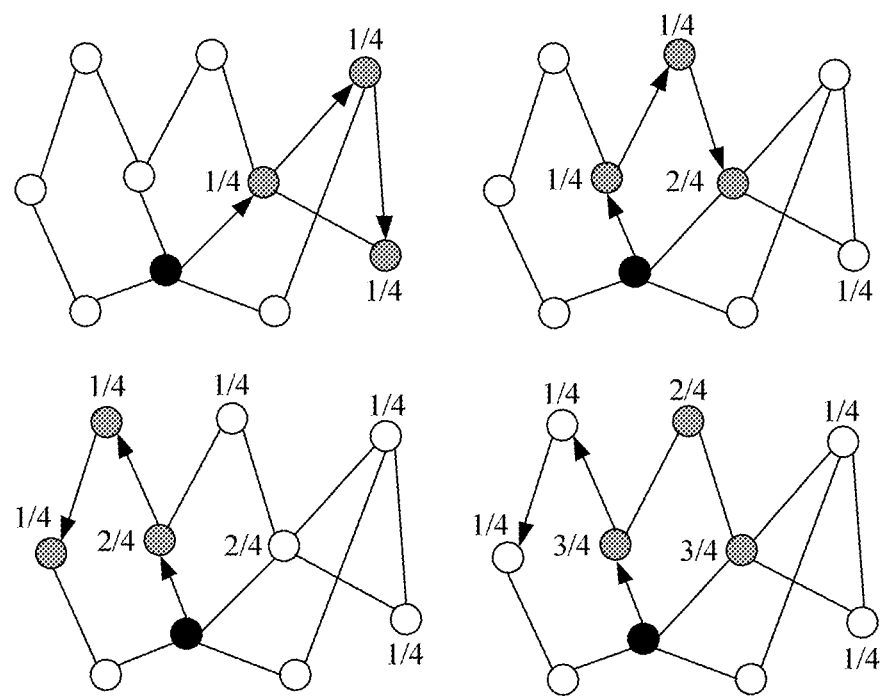
FIG. 5 is an optional schematic processing diagram of calculating an influence of each node in an obtained sampled sub-graph according to an embodiment.

FIG. 5 is an optional schematic processing diagram of calculating an influence of each node in an obtained sampled sub-graph according to an embodiment. Three-step random walk is simulated for the sampled sub-graph in FIG. 5 for five times. Initially, influence values of all nodes are 0. When a node is accessed in a walk, the influence value of the node is increased by 1/5. After the random walk is performed for the sampled sub-graph for five times, for each node, the influence value of the node in each walk is accumulated, to obtain distribution of the influence values of the nodes in the sampled sub-graph.

Referring again to FIG. 3A, step 3 includes mapping the graph centrality determining results of the sampled sub-graphs to the original graph, to obtain an influence value of each node in the original graph.

In step 2, the influence value of each node in each sampled sub-graph is obtained through calculation, and based on calculation results, the influence values in sampled sub-graphs obtained through calculation are mapped to corresponding nodes in the original graph.

After the influence values of the nodes in the sampled sub-graphs obtained through sampling are mapped to the original graph, distribution of an influence value of each node in the original graph of the network is obtained. Sampling is a recursive definition of attenuation and summation. An influence value $P_t(i)$ of the node i in the original graph is:

$$P_t(i) = \begin{cases} D_t(i), & \text{if } i \in G_t \\ \sum_{j \in in-link[i]} p \cdot P_t(j), & \text{if } i \notin G_t \end{cases}.$$

Figure 3D:
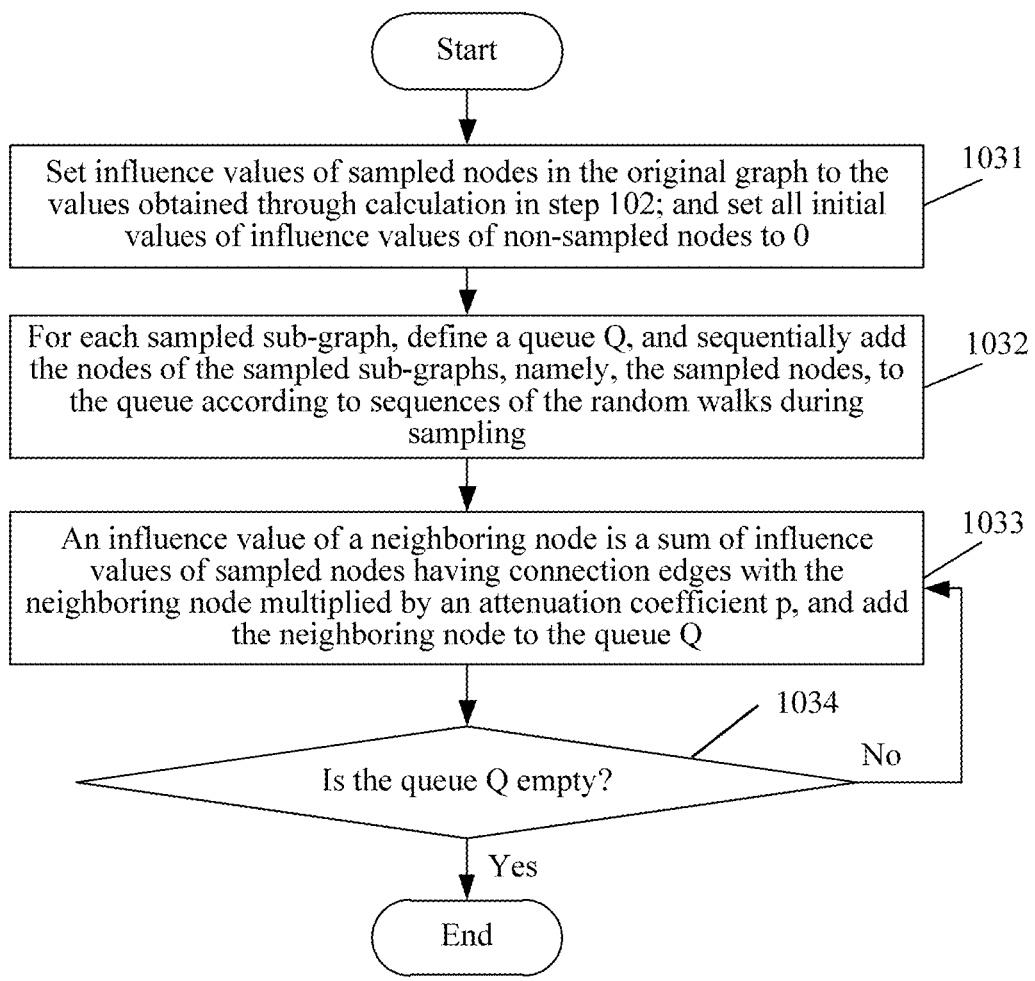
FIG. 3D is a schematic diagram of processing of the IM-RWS algorithm used for rapidly calculating the graph centrality according to the embodiment.

FIG. 3D is a schematic diagram of processing of the IM-RWS algorithm used for rapidly calculating the graph centrality according to the embodiment. As shown in FIG. 3D, a calculation process is as follows:

Step 1031: Set influence values of sampled nodes (nodes sampled to the sampled sub-graphs) in the original graph to the values obtained through calculation in step 2, that is, values obtained by accumulating the influence values of the nodes in the sampled sub-graphs; and for other nodes not sampled to the sampled sub-graphs, in which the nodes are called a non-sampled node, set all initial values of influence values of the non-sampled nodes to 0.

Step 1032: For each sampled sub-graph, define a queue Q, and sequentially add the nodes of the sampled sub-graphs, namely, the sampled nodes, to the queue according to a sequence of the random walk during sampling.

Step 1033: Select a sampled node from the queue according to the sequence, for all neighboring nodes $P_t(j)$ having connection edges (outgoing edges) with the sampled node, an influence value of a neighboring node is a sum of influence values $P_t(j)$ of sampled nodes having connection edges with the neighboring node multiplied by an attenuation coefficient p, then add the neighboring node to the queue Q.

Step 1034: Repeat step 1033 until the queue Q is empty.

Step 1032 to step 1034 are processing for a sampled sub-graph, and each sampled sub-graph corresponds to a queue Q. After step 1032 to step 1034 are performed for the sampled sub-graphs, a plurality of values of the influences of the nodes in the original graph may be obtained.

Figure 6:
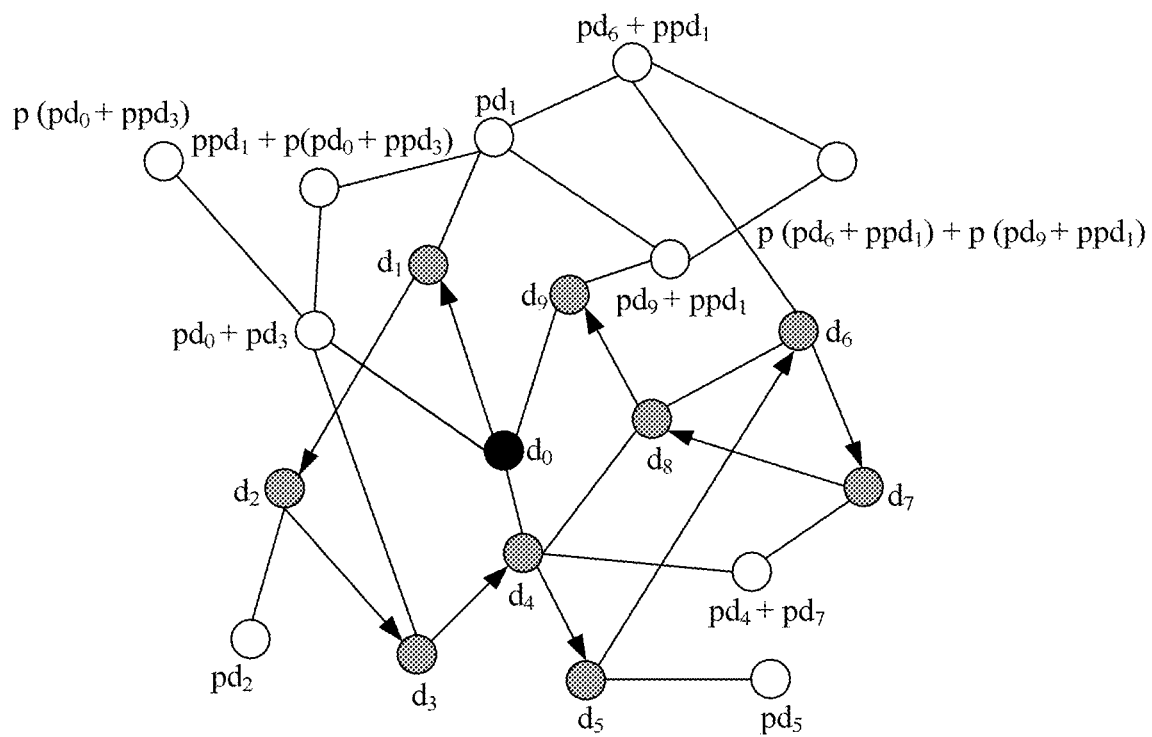
FIG. 6 is an optional schematic processing diagram of mapping influences of nodes in a sampled sub-graph to an original graph and calculating an influence of each node in the original graph according to an embodiment.

FIG. 6 is an optional schematic processing diagram of mapping influences of nodes in a sampled sub-graph to an original graph and calculating an influence of each node in the original graph according to an embodiment, and corresponds to the foregoing examples in which sampling is performed through random walk and the influences in the sampled sub-graphs are calculated. Node d0 to d9 in FIG. 6 are nodes in the sampled sub-graphs obtained through sampling, and corresponding influence values are calculated in step 3. However, for a non-sampled node in the original graph, an influence value of the non-sampled node is calculated by accumulating influence values of neighboring nodes multiplied by the attenuation coefficient p.

For example, in FIG. 6, if nodes having outgoing edges with a node pd9+ppd1 are the node d9 and a node pd1, an influence value of the node pd9+ppd1 is a product of the attenuation coefficient and the influence values of the node d9 and node pd1.

Referring back to FIG. 3A, step 4 includes clustering the influences of the stations obtained based on the different sampled sub-graphs are clustered, sort the influences in descending order of clustering results, and obtain a predetermined quantity of stations whose influences are top-ranked in the original graph.

Through step 3, each node of an entire social network graph has a plurality of influence values, and the plurality of values are clustered for averaging, to obtain an average influence value of the node. According to a sequence of the values, k nodes whose influence values are top-ranked are selected as to-be-solved most influential Top-k, and a set formed by the k nodes is a to-be-solved initial node set of the influence maximization problem. The clustering may be expressed by using the following formula:

$$P(n) = \frac{1}{T} \sum_{t=1}^{T} P_t(n).$$

A functional structure of the foregoing graph centrality calculation apparatus is described.

Figure 8:
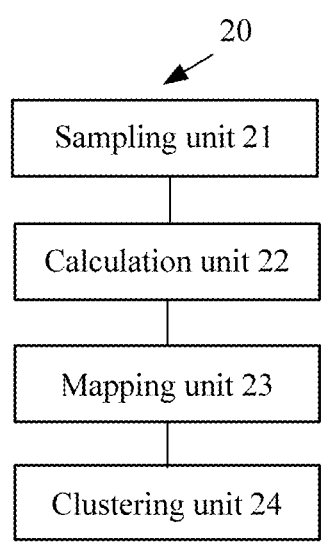
FIG. 8 is a schematic diagram of an optional structure of a graph centrality calculation apparatus according to an embodiment.

FIG. 8 is a schematic diagram of an optional functional structure of a graph centrality calculation apparatus 20 including a sampling unit 21, a calculation unit 22, a mapping unit 23, and a clustering unit 24. The units are described below.

The sampling unit 21 is configured to sample, at least twice, an original graph representing a network structure, to obtain at least two sampled sub-graphs formed by some sequentially connected nodes and connection edges between the nodes in the original graph.

In an embodiment, the sampling unit 21 performs, by using any node in the original graph as a starting node, a random walk operation in the original graph in a manner of selecting a neighboring node until a termination condition is satisfied, and forms the sampled sub-graphs based on the selected nodes and connection edges corresponding to the selected nodes in the original graph.

In addition, when the sampling unit 21 traverses the connection edges between the nodes in the sampled sub-graphs, and two vertexes of a connection edge are both located in a sampled sub-graph, the sampling unit 21 adds the connection edge into the sampled sub-graph.

Exemplarily, a calculation process for obtaining a sampled sub-graph by the sampling unit 21 is shown in FIG. 3B. Step 1011: Randomly select a node from the original graph as a starting node, and add node to the sampled sub-graph. Step 1012: Randomly select a neighboring node of the starting node to perform a random walk operation, and add a passed node to the sampled sub-graph. Step 1013: Use a node recently added to the sampled sub-graph as a new starting node, and repeat step 1012. Step 1014: Determine whether a terminal condition is satisfied: a quantity of nodes in the sampled sub-graph reaches a predetermined value n*; if the termination condition is not satisfied, return to step 1013, otherwise, perform step 1015. Step 1015: Traverse all connection edges of the nodes in the sampled sub-graph, and if both two vertexes of a connection edge are in the sampled sub-graph, add the connection edge to the sampled sub-graph.

FIG. 4 is an optional schematic processing diagram of sampling in an original graph through random walk according to an embodiment. For a to-be-sampled original graph, a solid node is an initially selected starting node, a node to which an arrow points is a passed node during the random walk, and the arrow indicates a direction of the walk. n* is set to 10. When a quantity of passed nodes reaches 10, the walk is stopped, and all the passed nodes and all connection edges between the nodes are sampled to the sampled sub-graph.

Referring back to FIG. 8, the calculation unit 22 is configured to separately calculate an influence value of each node in the sampled sub-graphs, to obtain graph centrality calculation results of the sampled sub-graphs.

In an embodiment, the calculation unit 22 performs a predetermined times of random walk operations for a sampled sub-graph, and allocates a predetermined influence value to an accessed node in each random walk operation until a quantity of accessed nodes in each random walk operation meets a predetermined value. A probability that is allocated by the calculation unit 22 to a passed node and that the passed node is accessed is accessed in random walk operation is the influence value of the corresponding node.

Referring to a method in the IM-RW algorithm herein, an L-step random walk are simulated for each node in a sampled sub-graph for R times, to calculate a probability that the node in the sampled sub-graph is accessed in the random walk. A calculation process of the calculation unit 22 is shown in FIG. 3C. Step 1021: Simulate an L-step random walk for each node i in a sampled sub-graph Gt for R (which is an integer greater than or equal to 1) times. Step 1022: First select a starting node in each random walk. Step 1023: Then randomly select a neighboring node of a current node, move to the neighboring node, and record that the walk has run one step. Step 1024: Use a node that is currently reached through walk as a new starting node, and repeat step 1023 until the walk has run L steps. Step 1025: When a node is accessed in a walk process, increase an influence value of the accessed node by 1/R. After the random walk is performed for the sampled sub-graph for R times, an influence value of each node in the sampled sub-graph may be obtained, and the influence value is represented by Dt(n*).

FIG. 5 is an optional schematic processing diagram of calculating an influence of each node in an obtained sampled sub-graph according to an embodiment. Three-step random walk is simulated for the sampled sub-graph in FIG. 5 for five times. Initially, influence values of all nodes are 0. When a node is accessed in a walk, the influence value of the node is increased by 1/5. After the random walk is performed for the sampled sub-graph for five times, for each node, the influence value of the node in each walk is accumulated, to obtain distribution of the influence values of the nodes in the sampled sub-graph.

Referring back to FIG. 8, the mapping unit 23 is configured to map the calculation results of the sampled sub-graphs to the original graph, to obtain a mapping result of each node in the original graph.

In an embodiment, the mapping unit 23 maps an influence of each node in the sampled sub-graphs to a corresponding sampled node in the original graph, to obtain at least one influence of the sampled node.

When mapping the influence value of each node in the sampled sub-graphs to the corresponding sampled node in the original graph, the sampling unit 23 may use the following method: determining sampled nodes having connection edges with a non-sampled node in the original graph, attenuating the influence value of the sampled node, and obtaining an influence value of the non-sampled node based on a sum of obtained attenuations.

In step 2 of FIG. 3A, the influence value of each node in each sampled sub-graph is obtained through calculation, and based on calculation results, the influence values in sampled sub-graphs obtained through calculation are mapped to corresponding nodes in the original graph.

Exemplarily, by mapping the influence values of the nodes in the sampled sub-graphs obtained through sampling to the original graph, the mapping unit 23 obtains distribution of an influence value of each node in the original graph of the network. Sampling is a recursive definition of attenuation and summation. An influence value $P_t(i)$ of the node i in the original graph is:

$$P_t(i) = \begin{cases} D_t(i), & \text{if } i \in G_t \\ \sum_{j \in in-link[i]} p \cdot P_t(j), & \text{if } i \notin G_t \end{cases}.$$

A calculation process is shown in FIG. 3D, and includes the following steps:

Step 1031: Set influence values of sampled nodes (nodes sampled to the sampled sub-graphs) in the original graph to the values obtained through calculation in step 2, that is, values obtained by accumulating the influence values of the nodes in the sampled sub-graphs; and for other nodes not sampled to the sampled sub-graphs, in which the nodes are called a non-sampled node, set all initial values of influence values of the non-sampled nodes to 0.

Step 1032: For each sampled sub-graph, define a queue Q, and sequentially add the nodes of the sampled sub-graphs, namely, sampled nodes, to the queue according to a sequence of the random walk.

Step 1033: Select a sampled node from the queue according to the sequence, for all neighboring nodes $P_t(j)$ having connection edges (outgoing edges) with the sampled node, an influence value of a neighboring node is a sum of influence values $P_t(j)$ of sampled nodes having connection edges with the neighboring node multiplied by an attenuation coefficient p, then add the neighboring node to the queue Q.

Step 1034: Repeat step 1033 until the queue Q is empty.

Step 1032 to step 1034 are processing for a sampled sub-graph, and each sampled sub-graph corresponds to a queue Q. After step 1032 to step 1034 are performed for the sampled sub-graphs, a plurality of values of the influences of the nodes in the original graph may be obtained.

FIG. 6 is an optional schematic processing diagram of mapping influences of nodes in a sampled sub-graph to an original graph and calculating an influence of each node in the original graph according to an embodiment, and corresponds to the foregoing examples in which sampling is performed through random walk and the influences in the sampled sub-graphs are calculated. Node d0 to d9 in FIG. 6 are nodes in the sampled sub-graphs obtained through sampling, and corresponding influence values are calculated in step 3. However, for a non-sampled node in the original graph, an influence value of the non-sampled node is calculated by accumulating influence values of neighboring nodes multiplied by the attenuation coefficient p.

Referring back to FIG. 8, the clustering unit 24 is configured to cluster mapping results of the sampled sub-graphs in the original graph, to obtain a centrality calculation result of the original graph.

For example, the influences obtained by mapping the nodes in the original graph to the original graph are averaged, the average values are sorted in descending order, and the predetermined quantity of nodes that are top-ranked in the original graph are obtained as a centrality determining result of the original graph.

For example, after processing by the mapping unit 23, each node of an entire network graph has a plurality of influence values, and the plurality of values are clustered for averaging, to obtain an average influence value of the node. According to a sequence of the values, k nodes whose influence values are top-ranked are selected as to-be-solved most influential Top-k, and a set formed by the k nodes is a to-be-solved initial node set of the influence maximization problem. The clustering may be expressed by using the following formula:

$$P(n) = \frac{1}{T} \sum_{t=1}^{T} P_t(n).$$

In the embodiments described above, the time complexity of the IM-RWS algorithm obtained through analysis is $O(Tn^*)+O(TRLn^*)+O(Tn)$. During implementation, $R=100$, $L=3$, and $n^*=n/100$ are set, and comprehensive time complexity approaches $O(Tn)$. However, a better effect can be achieved when T is usually 10. Therefore, the time complexity of the IM-RWS algorithm is significantly reduced. Through comparison, it is learned that, for the influence maximization problem, while the program running efficiency of the IM-RWS algorithm that is designed and implemented by using a graph calculation framework based on sampling provided in the embodiments is greatly improved, the accuracy of some large graphs of online social networks is also increased.

The following verifies acceleration of the graph centrality calculation according to the embodiments with reference to experiments.

TABLE 1

| Database | User | User-User (Connection Edge) |
|---|---|---|
| Ciao | 2342 | 57544 |
| NetHEPT | 15229 | 62752 |
| Epinions | 18089 | 355813 |
| Slashdot0811 | 77360 | 905468 |

TABLE 1-continued

| Database | User | User-User (Connection Edge) |
|---|---|---|
| Slashdot0902 | 82168 | 948464 |
| Yelp | 174100 | 2576179 |
| Flixster | 300000 | 6394798 |
| LiveJournal | 4847571 | 68993773 |

TABLE 2

| | |
|---|---|
| -G | Online social network G |
| -N | A quantity of nodes in G |
| -M | A quantity of connection edges in G |
| -d | Centrality of each node in G |
| -k | A largest value of a seed information set |
| -T | A quantity of sampled sub-graphs |
| -SR | A sampling rate of a sampled sub-graph |
| -R | A quantity of times that random walk is performed (for each node in a sampled sub-graph) |
| -L | A quantity of steps of each random walk |
| -M | Influence combination model |

TABLE 3

| Algorithm | Parameter | Setpoint |
|---|---|---|
| Select top K | -k | 5, 10, 15, 20, 25, 30, 35, 40, 45, and 50 |
| Select a sampled sub-graph from an OSN | -T | 10 |
| | -SR | 1% |
| Calculate an influence in a sub-graph | -R | 100 |
| | -L | 3 |
| Calculate a spreaded influence | -M | IC |

Figure 7A:
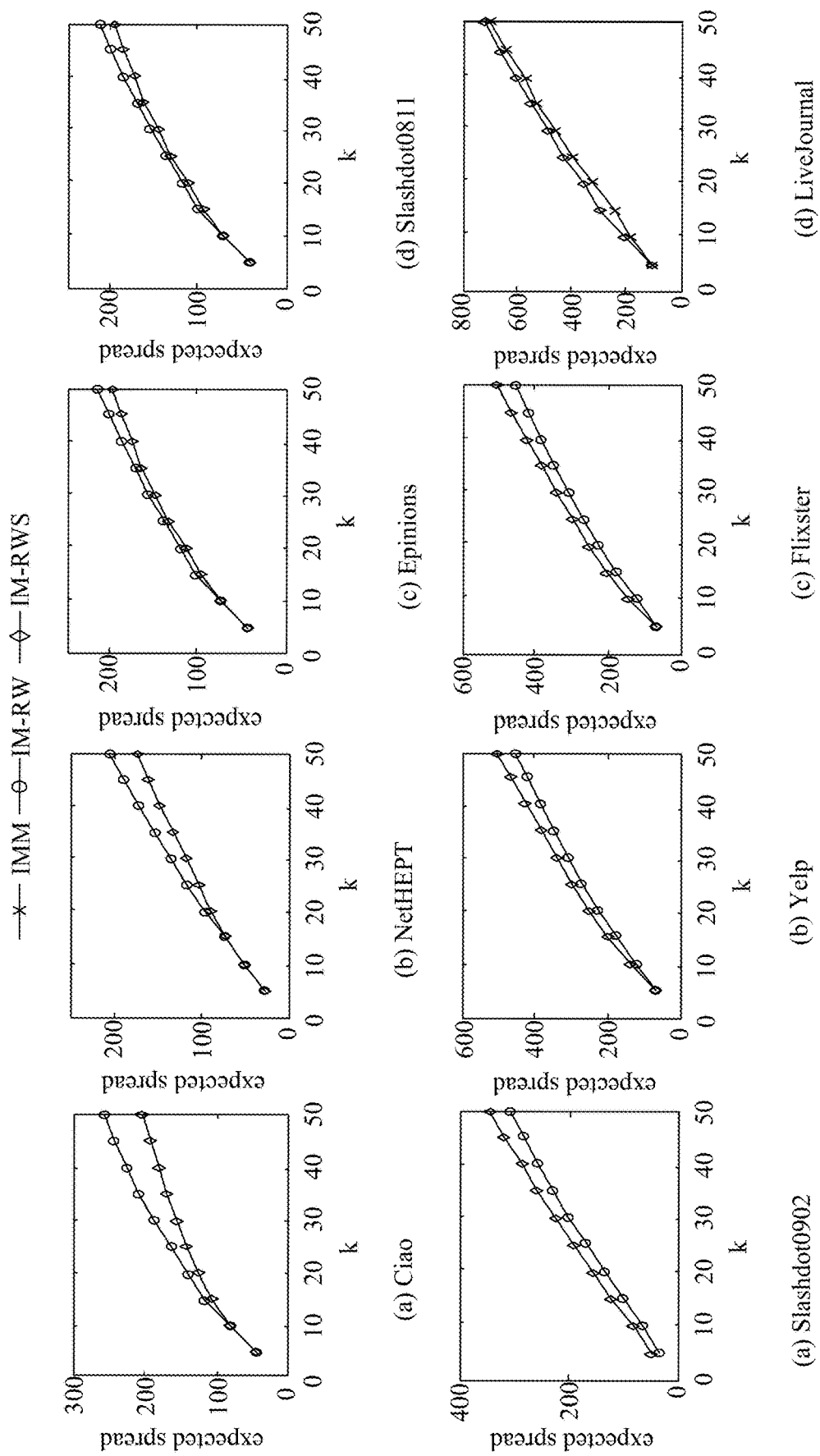
FIG. 7A is a schematic diagram of calculation precision comparison of a rapid graph centrality calculation algorithm according to an embodiment, with an IMM algorithm and an IM-RW algorithm in the related technology.
Figure 7B:
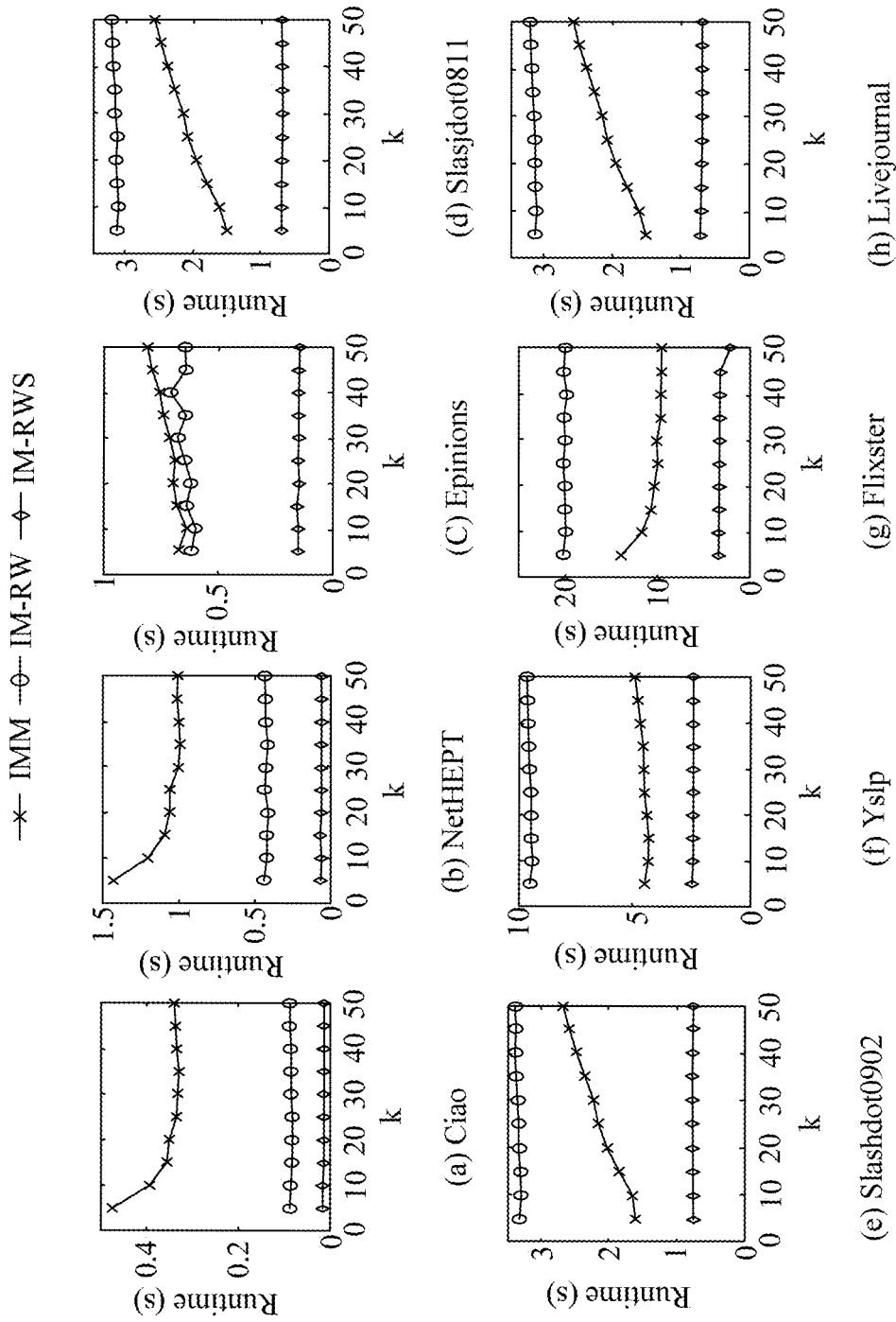
FIG. 7B is a schematic diagram of calculation efficiency comparison of a rapid graph centrality calculation algorithm according to an embodiment, with an IMM algorithm and an IM-RW algorithm in the related technology.

Related experiment data is shown in Table 1 to Table 3. Based on the foregoing experiment data, the rapid graph centrality calculation algorithm based on the embodiments is compared with the IMM algorithm and IM-RW algorithm in the related technology. A schematic diagram of comparison of the calculation accuracy is shown in FIG. 7A, and a schematic diagram of comparison of the calculation efficiency is shown in FIG. 7B. Experiments indicate that sampling is first performed in a large original graph, and an influence of each sampling result is calculated and combined, so that, on one hand, the algorithm efficiency can be significantly improved, and the calculation time is shorten, to accelerate calculation of the graph centrality, and on the other hand, the calculation accuracy of the graph centrality is ensured.

Figure 9:
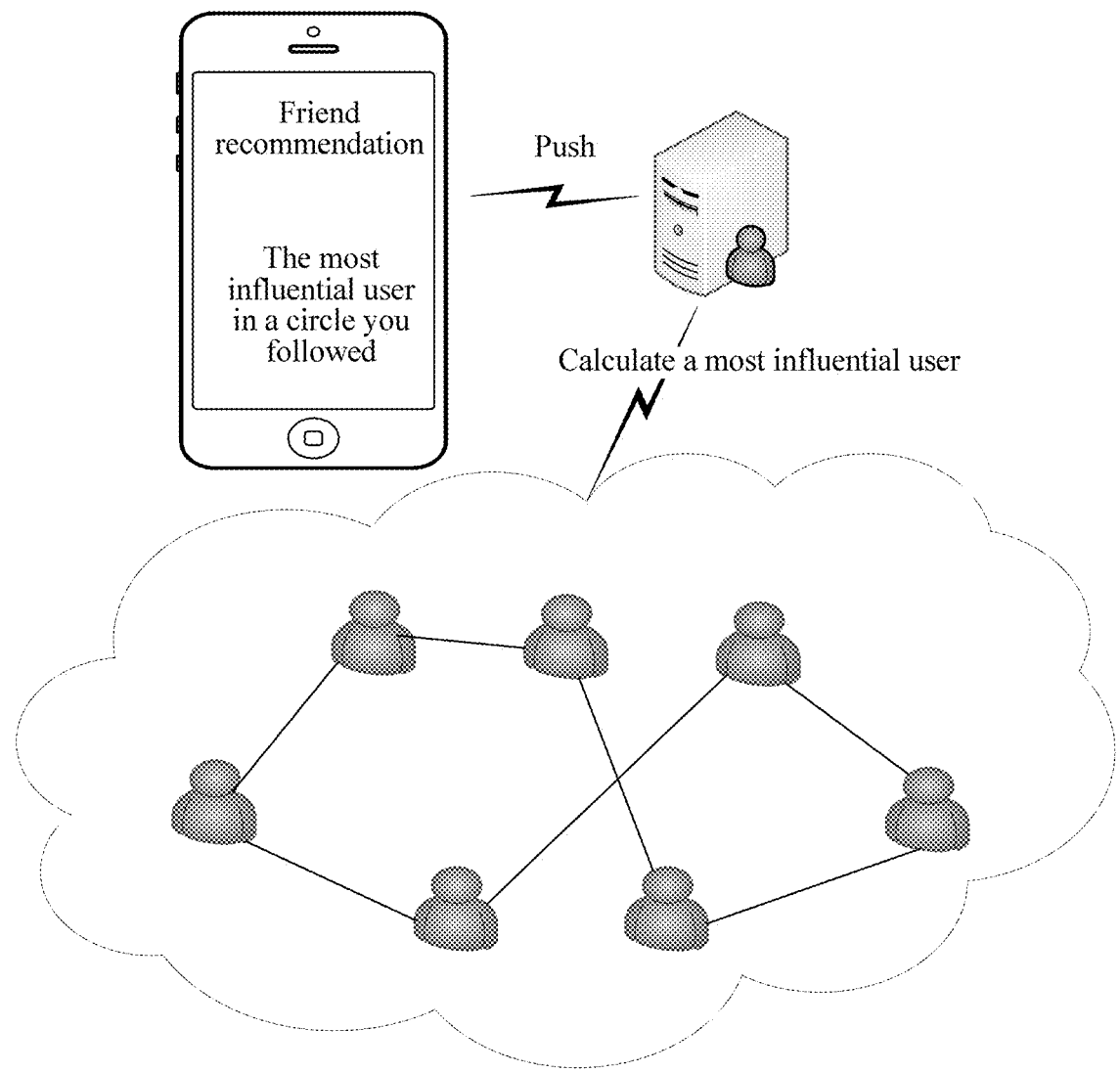
FIG. 9 is a schematic diagram of an optional application scenario of a graph centrality calculation method according to an embodiment.

FIG. 9 is a schematic diagram of an optional application scenario of a graph centrality calculation method according to an embodiment.

In the embodiment of FIG. 9, a node is a user in a social network. Herein, a relationship of mutual following between users in the social network forms connection edges between nodes. Users as the nodes and the following relationships between the users form an original graph.

As shown in FIG. 9, a graph centrality calculation apparatus is disposed in a social background. For example, the centrality calculation apparatus may be an independent calculation apparatus, or may be a set of a plurality of distributed calculation apparatuses. The graph centrality may provide basic instant messaging service and sharing service to a social application client by using the network. For example, the client may be a laptop computer, a desktop computer, a mobile phone, a tablet computer, a personal digital assistant, or any other terminal device that can access the graph centrality calculation apparatus disposed in the social background. Communication between the social background and the client may be performed in a wireless or wired manner.

The centrality calculation apparatus of the social background may analyze the mutual following relationship between the social users based on, for example, a background log. Herein, for example, the log may be stored in a local database of the centrality calculation apparatus, or may be stored in a remote database of the centrality calculation apparatus. In addition, the calculation apparatus of the social background may form the connection edges between the nodes based on the mutual following relationship between the users of the social network. For example, when a first user follows a second user, in a graph of the social network, the node representing the first user has a connection with the node representing the second user, that is, has a connection edge. Therefore, the centrality calculation apparatus of the social background obtains an original graph from the mutual following relationship between the nodes representing the users.

After the original graph is obtained, the centrality calculation apparatus of the social background may sample, at least twice, sequentially users and connection edges between the users in the original graph, to obtain at least two sampled sub-graphs (for example, 10 sampled sub-graphs). Herein, more than 10 sampled sub-graphs or less than 10 but not less than two sampled sub-graphs may be obtained according to a requirement. A quantity of sampled sub-graphs is not limited to 10.

Next, the centrality calculation apparatus of the social background may determine an influence of each user in each sampled sub-graph, and form a centrality determining result of the sampled sub-graph. 10 centrality determining results may be obtained herein.

Then, the centrality calculation apparatus of the social background may map the 10 centrality determining results to the original graph, to obtain an influence of each user in the original graph.

After obtaining the influence of each user in the original graph, the centrality calculation apparatus of the social background may cluster the influence of each node obtained based on the 10 sampled sub-graphs. The centrality calculation apparatus of the social background may sort the influences according to a clustering result, to obtain a predetermined quantity of users whose influences are top-ranked. For example, the predetermined quantity may be set to 4. The predetermined quantity may be greater than 4 or less than 4, but is not limited to 4 herein.

After obtaining four users whose influences are top-ranked, the centrality calculation apparatus of the social background pushes the four users to the client. In this way, the client may learn most influential users in the social network.

The social network herein may alternatively be divided into a plurality of different interest groups. The centrality calculation apparatus of the social background calculates a mutual following relationship between users in a different interest groups of the social network, to determine a most influential user in the interest group, and recommend the most influential user to a terminal of a user just participating in the interest group.

A person skilled in the art may understand that, some or all of steps for implementing the method embodiments may be implemented by using hardware related to a program instruction. The program may be stored in a computer readable storage medium. When the program is executed, the steps including the method embodiments are performed. However, the storage medium includes various types of media that may store program code, for example, a mobile storage device, a random access memory (RAM), a read-only memory (ROM), a magnetic disk, or an optical disk.

Alternatively, in the embodiments, if implemented in the form of software functional units and sold or used as independent products, the integrated modules may be stored in a computer-readable storage medium. Based on such an understanding, the technical solutions of the embodiments, or the part contributing to the related technology may be implemented in a form of a software product. The computer software product is stored in a storage medium and includes several instructions for instructing a computer apparatus (which may be a personal computer, a server, a network apparatus, or the like) to perform all or some of the methods described in the embodiments. The foregoing storage medium includes: any media that can store program code, such as a portable storage device, a RAM, a ROM, a magnetic disk, or an optical disc.

As is traditional in the field of the inventive concepts, the example embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the example embodiments may be physically separated into two or more interacting and discrete blocks, units and/or modules without departing from the scope of the inventive concepts. Further, the blocks, units and/or modules of the example embodiments may be physically combined into more complex blocks, units and/or modules without departing from the scope of the inventive concepts.

The foregoing descriptions are implementations, but are not intended to limit the protection scope. Any variation or replacement readily figured out by a person skilled in the art within the technical scope shall fall within the protection scope. Therefore, the protection scope shall be subject to the protection scope of the claims.

INDUSTRIAL PRACTICABILITY

According to the embodiments, a large original graph of a network is sampled to obtain a sampled sub-graph. In this way, the size of the original graph is reduced, to resolve a problem of large time overheads and determining difficulty in determining graph centrality due to excessive large original graph of the network, thereby increasing the determining efficiency of an algorithm, greatly shortening a determining time, and accelerating determining of the graph centrality. A determining result of each sampled sub-graph mapped to the original graph is combined to obtain a graph centrality determining result of the original graph, thereby ensuring the accuracy of determining the graph centrality of the original graph.

What is claimed is:

1. A graph centrality determining method, the method being performed by at least one processor, and the method comprising:
sampling, at least twice, nodes that are sequentially-connected and connection edges between the nodes, in an original graph representing a network structure, to obtain sampled sub-graphs;
determining an influence of each of nodes in the sampled sub-graphs;
forming a graph centrality determining result of each of the sampled sub-graphs, based on the influence of each of the nodes in the sampled sub-graphs;
mapping the graph centrality determining result of each of the sampled sub-graphs, to the original graph, to obtain an influence of each of the nodes in the original graph,
wherein the mapping the graph centrality determining result of each of the sampled sub-graphs, to the original graph comprises:
determining, for the sampled sub-graphs, one or more sampled nodes having a connection edge with a non-sampled node, among the nodes that are sampled in the original graph;
attenuating an influence of each of the determined one or more sampled nodes; and
determining an influence of the non-sampled node, based on a sum of the attenuated influence of each of the one or more sampled nodes;
clustering the influence of each of the nodes in the original graph;
sorting the influence of each of the nodes in the original graph in descending order of a result of the clustering; and
obtaining a predetermined quantity of nodes having influences that are top-ranked, in the original graph.

2. The method according to claim 1, wherein the sampling comprises:
performing, by using any node in the original graph as a starting node, a random walk operation in the original graph, by selecting one or more neighboring nodes in the original graph until a termination condition is satisfied; and
forming the sampled sub-graphs, based on the one or more neighboring nodes that are selected and connection edges corresponding to the one or more neighboring nodes that are selected, in the original graph.

3. The method according to claim 1, further comprising:
traversing connection edges between the nodes in one of the sampled sub-graphs; and
based on two vertexes of one of the connection edges being both located in the one of the sampled sub-graphs, adding the one of the connection edges into the one of the sampled sub-graphs.

4. The method according to claim 1, wherein the determining the influence of each of the nodes in the sampled sub-graphs comprises:
performing predetermined times of random walk operations for one of the sampled sub-graphs; and
allocating a predetermined influence for an accessed node during each of the random walk operations until a quantity of nodes that is accessed during the a respective one of the random walk operations meets a predetermined value.

5. The method according to claim 4, wherein the allocating the predetermined influence for the accessed node during each of the random walk operations comprises allocating, for the accessed node, a probability that the accessed node is accessed during the respective one of the random walk operations, as the influence of a respective one of the nodes in the one of the sampled sub-graphs.

6. The method according to claim 1, wherein the mapping the graph centrality determining result of each of the sampled sub-graphs, to the original graph comprises:
mapping the influence of each of the nodes in the sampled sub-graphs, respectively to the nodes that are sampled in the original graph; and
obtaining at least one influence of the nodes to which the influence of each of the nodes in the sampled sub-graphs is mapped.

7. The method according to claim 1, further comprising:
calculating average values of the influence of each of the nodes in the original graph;
sorting the average values in descending order; and
obtaining the predetermined quantity of the nodes having the influences that are top-ranked, in the original graph, as a centrality determining result of the original graph.

8. The method according to claim 1, wherein each of the nodes corresponds to a user and the network structure corresponds to a social network, or
each of the nodes corresponds to a station and the network structure corresponds to an urban transport network, or
each of the nodes corresponds to a product and the network structure corresponds to an online store.

9. A graph centrality determining apparatus comprising:
at least one memory configured to store computer program code; and
at least one processor configured to access the at least one memory and operate according to the computer program code, the computer program code comprising:
sampling code configured to cause the at least one processor to sample, at least twice, nodes that are sequentially-connected and connection edges between the nodes, in an original graph representing a network structure, to obtain sampled sub-graphs;
determining code configured to cause the at least one processor to:
determine an influence of each of nodes in the sampled sub-graphs; and
form a graph centrality determining result of each of the sampled sub-graphs, based on the influence of each of the nodes in the sampled sub-graphs;
mapping code configured to cause the at least one processor to map the graph centrality determining result of each of the sampled sub-graphs, to the original graph, to obtain an influence of each of the nodes in the original graph,
wherein the mapping code is further configured to cause the at least one processor to:
determine, for the sampled sub-graphs, one or more sampled nodes having a connection edge with a non-sampled node, among the nodes that are sampled in the original graph;
attenuate an influence of each of the determined one or more sampled nodes; and
determine an influence of the non-sampled node, based on a sum of the attenuated influence of each of the one or more sampled nodes; and
clustering code configured to cause the at least one processor to:

cluster the influence of each of the nodes in the original graph;
sort the influence of each of the nodes in the original graph in descending order of a result of the clustering; and
obtain a predetermined quantity of nodes having influences that are top-ranked, in the original graph.

10. The apparatus according to claim 9, wherein the sampling code is further configured to cause the at least one processor to:
perform, by using any node in the original graph as a starting node, a random walk operation in the original graph, by selecting one or more neighboring nodes in the original graph until a termination condition is satisfied; and
form the sampled sub-graphs, based on the one or more neighboring nodes that are selected and connection edges corresponding to the one or more neighboring nodes that are selected, in the original graph.

11. The apparatus according to claim 9, wherein the sampling code is further configured to cause the at least one processor to:
traverse connection edges between the nodes in one of the sampled sub-graphs; and
based on two vertexes of one of the connection edges being both located in the one of the sampled sub-graphs, add the one of the connection edges into the one of the sampled sub-graphs.

12. The apparatus according to claim 9, wherein the determining code is further configured to cause the at least one processor to:
perform predetermined times of random walk operations for one of the sampled sub-graphs; and
allocate a predetermined influence for an accessed node during each of the random walk operations until a quantity of nodes that is accessed during the a respective one of the random walk operations meets a predetermined value.

13. The apparatus according to claim 12, wherein the determining code is further configured to cause the at least one processor to allocate, for the accessed node, a probability that the accessed node is accessed during the respective one of the random walk operations, as the influence of a respective one of the nodes in the one of the sampled sub-graphs.

14. The apparatus according to claim 9, wherein the mapping code is further configured to cause the at least one processor to:
map the influence of each of the nodes in the sampled sub-graphs, respectively to the nodes that are sampled in the original graph; and
obtain at least one influence of the nodes to which the influence of each of the nodes in the sampled sub-graphs is mapped.

15. The apparatus according to claim 9, wherein the clustering code is further configured to cause the at least one processor to:

calculate average values of the influence of each of the nodes in the original graph;
sort the average values in descending order; and
obtain the predetermined quantity of the nodes having the influences that are top-ranked, in the original graph, as a centrality determining result of the original graph.

16. The apparatus according to claim 9, wherein each of the nodes corresponds to a user and the network structure corresponds to a social network, or
each of the nodes corresponds to a station and the network structure corresponds to an urban transport network, or
each of the nodes corresponds to a product and the network structure corresponds to an online store.

17. A non-transitory computer-readable storage medium storing instructions that cause at least one processor to:
sample, at least twice, nodes that are sequentially-connected and connection edges between the nodes, in an original graph representing a network structure, to obtain sampled sub-graphs;
determine an influence of each of nodes in the sampled sub-graphs;
form a graph centrality determining result of each of the sampled sub-graphs, based on the influence of each of the nodes in the sampled sub-graphs;
map the graph centrality determining result of each of the sampled sub-graphs, to the original graph, to obtain an influence of each of the nodes in the original graph;
cluster the influence of each of the nodes in the original graph;
sort the influence of each of the nodes in the original graph in descending order of a result of the clustering; and
obtain a predetermined quantity of nodes having influences that are top-ranked, in the original graph,
wherein the instructions further cause the at least one processor to:
determining, for the sampled sub-graphs, one or more sampled nodes having a connection edge with a non-sampled node, among the nodes that are sampled in the original graph;
attenuate an influence of each of the determined one or more sampled nodes; and
determine an influence of the non-sampled node, based on a sum of the attenuated influence of each of the one or more sampled nodes.

18. The non-transitory computer readable storage medium of claim 17, wherein the instructions further cause the at least one processor to:
perform, by using any node in the original graph as a starting node, a random walk operation in the original graph, by selecting one or more neighboring nodes in the original graph until a termination condition is satisfied; and
form the sampled sub-graphs, based on the one or more neighboring nodes that are selected and connection edges corresponding to the one or more neighboring nodes that are selected, in the original graph.

* * * * *